(12) United States Patent
Xie et al.

(10) Patent No.: US 8,617,973 B2
(45) Date of Patent: Dec. 31, 2013

(54) SEMICONDUCTOR DEVICE FABRICATION METHODS WITH ENHANCED CONTROL IN RECESSING PROCESSES

(75) Inventors: Ruilong Xie, Albany, NY (US); Robert J. Miller, Yorktown Heights, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 131 days.

(21) Appl. No.: 13/247,763

(22) Filed: Sep. 28, 2011

(65) Prior Publication Data

US 2013/0078791 A1    Mar. 28, 2013

(51) Int. Cl.
*H01L 21/3205* (2006.01)
*H01L 21/4763* (2006.01)

(52) U.S. Cl.
USPC .............................. 438/586; 438/694; 257/288

(58) Field of Classification Search
USPC .............. 438/586; 257/288, E21.19, E29.255
See application file for complete search history.

(56) References Cited

U.S. PATENT DOCUMENTS

| | | | |
|---|---|---|---|
| 4,756,794 A | 7/1988 | Yoder | |
| 2011/0062501 A1* | 3/2011 | Soss et al. | 257/288 |
| 2011/0133283 A1* | 6/2011 | Park et al. | 257/368 |
| 2012/0139061 A1* | 6/2012 | Ramachandran et al. | 257/410 |
| 2013/0043592 A1* | 2/2013 | Park et al. | 257/754 |

OTHER PUBLICATIONS

"Achieving Area-Selective Atomic Layer Deposition on Patterned Substrates by Selective Surface Modification," Rong Chen et al., Applied Physics Letter, 86, 191910, 2005.

* cited by examiner

*Primary Examiner* — Phuc Dang
(74) *Attorney, Agent, or Firm* — Ingrassia Fisher & Lorenz, P.C.

(57) ABSTRACT

Semiconductor device fabrication methods having enhanced control in recessing processes are provided. In a method for fabricating a semiconductor device or plurality of them, a structure is formed. The method includes preparing a limited amount of the structure having a depth of less than ten atomic layers for removal. Further, the method includes performing a removal process to remove the limited amount of the structure. The method repeats preparation of successive limited amounts of the structure for removal, and performance of the removal process to form a recess at an upper portion of the structure.

20 Claims, 7 Drawing Sheets

SEMICONDUCTOR DEVICE FABRICATION METHODS WITH ENHANCED CONTROL IN RECESSING PROCESSES

TECHNICAL FIELD

The present disclosure generally relates to methods for fabricating semiconductor devices, and more particularly relates to such semiconductor device fabrication methods that provide enhanced control in recessing processes.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

Continuous scaling of complementary metal-oxide-semiconductor (CMOS) devices requires borderless source/drain contact for self-aligned source/drain contact (SAC). When gate to gate pitch is extremely scaled, conventional source/drain contact technology faces gate-to-source/drain shorting issues. Borderless contacts have been used to prevent the shorting issues. To realize borderless contacts in replacement gate technology, a dielectric capping layer is typically formed on top of the gate so that the gate is isolated from the source/drain contact.

One method used to form the dielectric capping layer on top of the gate involves recessing the replacement gate electrode, typically metal consisting of work function metals, and aluminum, tungsten or silicon gap fill materials. Then, the recess is filled with dielectric material and the capping layer is deposited on top of the gate structure and polished. However, the recessing process is difficult to replicate uniformly across a plurality of gates on the wafer substrate during integrated circuit fabrication. The conventional etch process typically used in recessing is a landing process, i.e., it completely etches a selected material and stops when it reaches a different material. However, recessing the replacement gate electrode is not a landing process because recessing is not stopped at a different material. Rather, an upper portion of the fill material is removed until recessing is purposely stopped, leaving an underlying portion of the same fill material. Therefore, it is difficult to control within wafer (WIW) and wafer to wafer (WTW) uniformity to meet manufacturing standards. In fact, any integrated circuit fabrication process with direct etching without landing is extremely difficult to control in terms of etch rate, WIW variation, and WTW uniformity. Further, for aluminum, current etch processes may continue beyond the desired stopping point even after the process is stopped due to residual etching chemicals.

Accordingly, it is desirable to provide semiconductor device fabrication methods with enhanced control in recessing processes. In addition, it is desirable to provide semiconductor device fabrication methods that recess materials in repeatable increments on the order of an atomic layer. Furthermore, other desirable features and characteristics will become apparent from the subsequent detailed description and the appended claims, taken in conjunction with the accompanying drawings and this background.

SUMMARY

Semiconductor device fabrication methods having enhanced control in recessing processes are provided. In accordance with an exemplary embodiment, a method for fabricating a semiconductor device or a plurality of them with enhanced control in recessing processes includes forming a structure. The method includes preparing a limited amount of the structure having a depth of less than ten atomic layers for removal. Further, the method includes performing a removal process to remove the limited amount of the structure. The method repeats preparation of successive limited amounts of the structure for removal, and performance of the removal process to form a recess at an upper portion of the structure.

In accordance with another exemplary embodiment, a semiconductor device fabrication method includes forming a replacement gate electrode over a substrate. Thereafter, a limited amount of the replacement gate electrode is prepared for removal. Also, a removal process is performed to remove the limited amount of the replacement gate electrode to form a recess at an upper portion of the replacement gate electrode. The method repeats preparation of successive limited amounts of the structure for removal, and performance of the removal process to form a recess at an upper portion of the structure. Further, the method deposits a dielectric layer in the recess, and forms a self-aligned contact.

Another exemplary embodiment provides a semiconductor device fabrication method that includes forming a removable gate electrode over a substrate. The removable gate electrode includes a high-K gate dielectric layer, a metal layer on the gate dielectric layer, and polysilicon. Spacers are formed on side surfaces of the removable gate electrode, a hardmask is formed over the polysilicon, and a silicide is formed on the substrate. An SAC stop layer is deposited over the hardmask layer, the spacers, and the silicide. Further, an isolation material is deposited over the SAC stop layer. The hardmask layer and the polysilicon are removed from the removable gate electrode to form an opening. A metal lining is deposited in the opening and aluminum fill or a similar appropriately conductive metal (or semiconductor alternatives) is deposited on the metal lining in the opening to form a replacement gate electrode. A limited amount of the replacement gate electrode is prepared for removal. A removal process is performed to remove the limited amount of the replacement gate electrode to form a recess at an upper portion of the replacement gate electrode. The method repeats preparation of successive limited amounts of the structure for removal, and performance of the removal process to form a recess at an upper portion of the structure. A dielectric layer is deposited in the recess, and a self-aligned contact is formed.

BRIEF DESCRIPTION OF THE DRAWINGS

Exemplary embodiments will hereinafter be described in conjunction with the following drawing figures, in which like reference numerals refer to similar elements and in which.

DETAILED DESCRIPTION

The following detailed description is merely exemplary in nature and is not intended to limit the semiconductor device fabrication methods described. Furthermore, there is no intention to be bound by any theory presented in the preceding background or the following detailed description. Also, additional components may be included in the integrated circuits, and additional processes may be included in the fabrication methods but are not described herein for purposes of clarity. For the purposes of explanation, numerous specific details are set forth in order to provide a thorough understanding of exemplary embodiments. It should be apparent, however, that exemplary embodiments may be practiced without these specific details or with an equivalent arrangement.

Semiconductor device fabrication methods are contemplated herein. The methods provided achieve enhanced control of recessing processes. In certain embodiments, two processes are performed to form a recess at a peripheral portion of a structure during fabrication of a semiconductor device or plurality of them. Specifically, in one process, a limited amount of the structure, for example, less than ten atomic layers, is prepared for removal. In another process, the limited amount of the structure is removed. In certain embodiments, these two processes are performed concurrently and repeatedly to form a recess of preselected depth. In other embodiments, these two processes are performed repeatedly in alternating cycles. Because the preparation process is controllable to prepare the limited amount of the structure having a selected depth for removal, and because the removal process does not remove the unprepared structure beneath the selected depth, control of the recessing process is enhanced.

Figure 1:
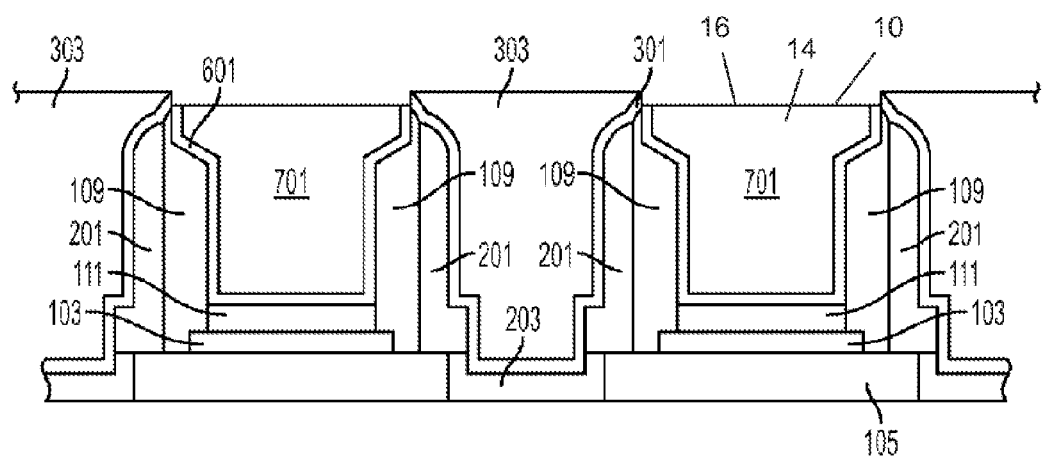
FIGS. 1-5 schematically illustrate, in cross-sectional views, recessing processes in an integrated circuit fabrication method according to exemplary embodiments.

Referring to FIG. 1, a method for fabricating a semiconductor device or plurality of them, in accordance with an exemplary embodiment, includes a recessing process with enhanced control. As shown in FIG. 1, a structure 10 has been formed over a substrate 105 and is formed by a fill material. In certain embodiments, the structure 10 is a replacement gate electrode 701 and the fill material is a metal, such as aluminum, tungsten, silicon or a semiconductor material (like Si or SiGe). The substrate 105 may be a silicon or SOI substrate. As shown, the structure 10 includes an upper portion 14 and an exposed surface 16.

Figure 2:
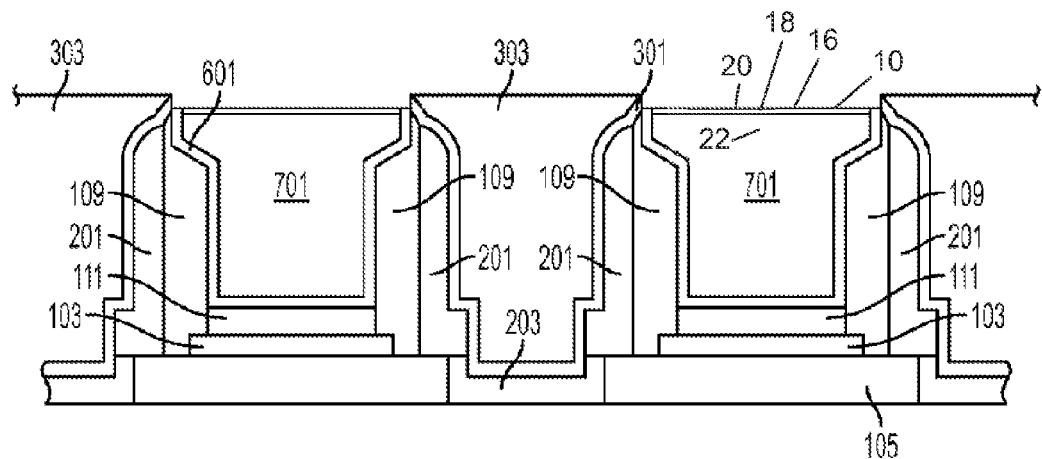

In FIG. 2, a limited amount 18 of the structure 10, such as, for example, a depth of fewer than ten atomic layers from the exposed surface 16, is prepared for removal. In certain embodiments, the limited amount 18 may have a depth of fewer than five atomic layers, more preferably fewer than three atomic layers, or still more preferably one atomic layer.

As shown in FIG. 2, to prepare the limited amount 18 of the structure 10 for removal, a surface treatment process is performed to transform the exposed surface 16 of the structure 10 to an intermediate etchable layer 20. The intermediate etchable layer 20 includes the limited amount 18 for removal. In exemplary embodiment, the surface treatment process is an oxidation process, the exposed surface 16 of the structure 10 is oxidized, and the intermediate etchable layer 20 is an oxidized layer. For example, for a structure 10 that is aluminum, oxygen plasma, nitric oxide plasma, ozone or another oxygen source is delivered to flood the exposed surface 16 of the structure 10. As a result, the exposed surface 16 is oxidized to an intermediate etchable layer 20 of $Al_2O_3$. For an aluminum structure 10, the surface treatment process may be chosen to transform the limited amount 18 of structure 10 to other removable compounds including for example, $Al_xN_y$, $AlO_xN_y$, $Al_xF_y$, or other known intermediates. To form the intermediate etchable layer 20, the structure 10 may be transforming from crystal to amorphous or other compounds.

In the method, a removal process is performed to remove the intermediate etchable layer 20. In certain embodiments, the intermediate etchable layer 20 that is formed is selected to have a slow etching rate such that etching of the intermediate etchable layer 20 is highly controllable. Because the underlying layer 22 beneath the intermediate etchable layer 20 may have a faster etching rate and be subject to etching processes that are more difficult to control, it is preferred that the surface treatment process ensures the presence of the intermediate etchable layer 20 over the underlying layer 22, and never allows the underlying layer 22 to become exposed to the etching chemistry. To accomplish this, the rate of formation of the intermediate etchable layer 20 by the surface treatment process is balanced with the rate of removal of the intermediate etchable layer 20 by the removal process. As a result, the uncontrolled removal of the underlying layer 22 is avoided.

In an exemplary embodiment in which the intermediate etchable layer 20 is $Al_2O_3$, the removal process may use a $Cl_2$-based, $BCl_3$-based, $C_xH_y$-based, $CH_xF_y$-based, or similar etching chemistry to etch the intermediate etchable layer 20. By carefully controlling the amount of chemistry exposure (e.g, by a pulse of gas flow) relative to the formation of the $Al_2O_3$ intermediate etchable layer 20, the intermediate etchable layer 20 is selectively removed without etching the underlying layer 22.

In an exemplary embodiment in which the intermediate etchable layer 20 is $SiO_2$, a known etching chemical may be selected to remove the intermediate etchable layer 20 while leaving the underlying layer 22 of the structure 10 intact. In such an embodiment, the balanced control of the rate of formation of the intermediate etchable layer 20 and the removal of the intermediate etchable layer 20 is less vital, as the etching chemistry will not remove the underlying layer 22. As a result of the inability of the removal process to etch the underlying layer 22 of the structure 10 in such embodiments, the removal process has an inherent stop that results from the surface treatment process.

Figure 3:
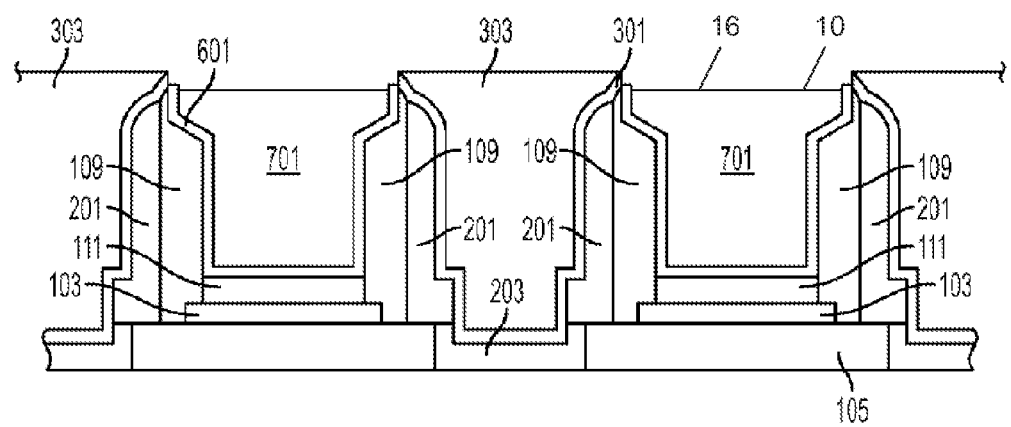
Figure 4:
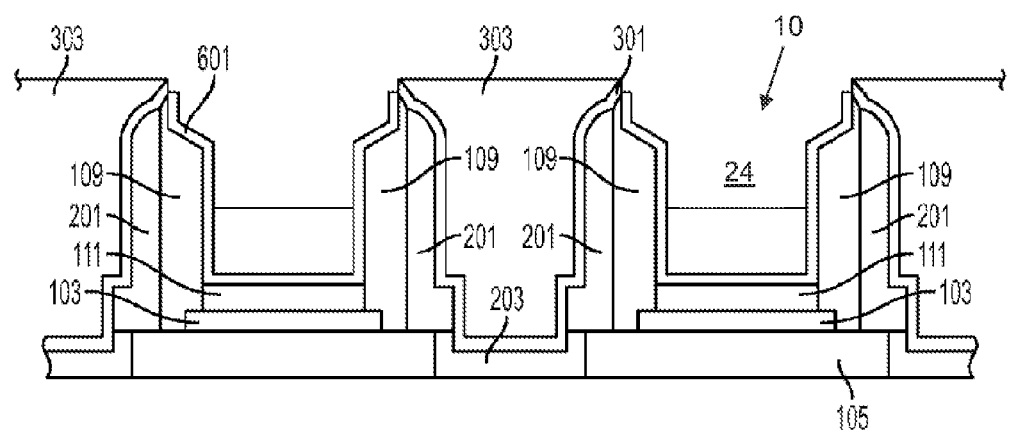

FIG. 3 illustrates the structure 10 after the initial processing, with intermediate etchable layer 20 removed and a new exposed surface 16. Such a configuration may occur for embodiments similar to when the underlying layer 22 is Si and the intermediate etchable layer 20 is $SiO_2$. However, in certain embodiments similar to when the underlying layer 22 is Al and the intermediate etchable layer 20 is $Al_2O_3$, the surface 16 is typically covered by the intermediate etchable layer 20 at all times to prevent uncontrolled etching of the underlying layer 22. As is understood, for either type of embodiment, the surface treatment process and removal process of FIGS. 1-3 are repeated for a selected number of iterations to form and remove a selected number of intermediate etchable layers 20 to form a recess 24 at the prior position of the upper portion 14 of the structure 10 as shown in FIG. 4.

In reference to FIGS. 1-3, it may be understood that, in certain embodiments, the surface treatment process and the removal process are performed repeatedly and concurrently. For example, in an exemplary embodiment, the exposed surface 16 of an aluminum structure 10 is repeatedly treated with an oxygen source, such as oxygen plasma or nitric oxide plasma, at the same time that an etching chemical is repeatedly delivered to the exposed surface 16. As a result, the exposed surface 16 is continuously transformed to the intermediate etchable layer 20, which is immediately etched by the etching chemistry. The removal process can be ended by stopping the etching chemistry flow. Because the etching rate of the intermediate etchable layer 20 is slow, the removal process is highly controllable.

In other embodiments, the surface treatment process and the removal process are repeated in alternate cycles. For example, the surface treatment process may be initiated and performed for a pulse or duration of time, such as for several minutes. During the selected duration of time, the intermediate etchable layer 20 is formed at the exposed surface 16 of the structure. Then the surface treatment process is ended, and the removal process is commenced. The etching chemical is delivered to the structure 10 and etches the intermediate etchable layer 20 during a pulse or duration of, for example, several minutes, leaving the underlying layer 22 as the new exposed surface 16. Then the surface treatment process is repeated and the removal process is repeated, in succession for a selected number of iterations until the recess 24 of desired depth is formed. For an embodiment using alternating cycles, a dry or wet etch may be used for the removal process. For example, the structure 10 may be wetted with $H_2O_2$ before etch chemistry (phosphoric acid+DI Water+Acetic acid+Nitric Acid mix) is used as the etching chemical.

In certain embodiments, the surface treatment process and the removal process may be repeated in alternate cycles that partially overlap. For instance, the method may include a period when the surface treatment process is performed alone, followed by a period of concurrent performance of the surface treatment process and the removal process, followed by a period when the removal process is performed alone, and so on. Further, there may be overlap at the end of the surface treatment process and beginning of the removal process and not at the end of the removal process and beginning of the surface treatment process, or vice versa.

Figure 5:
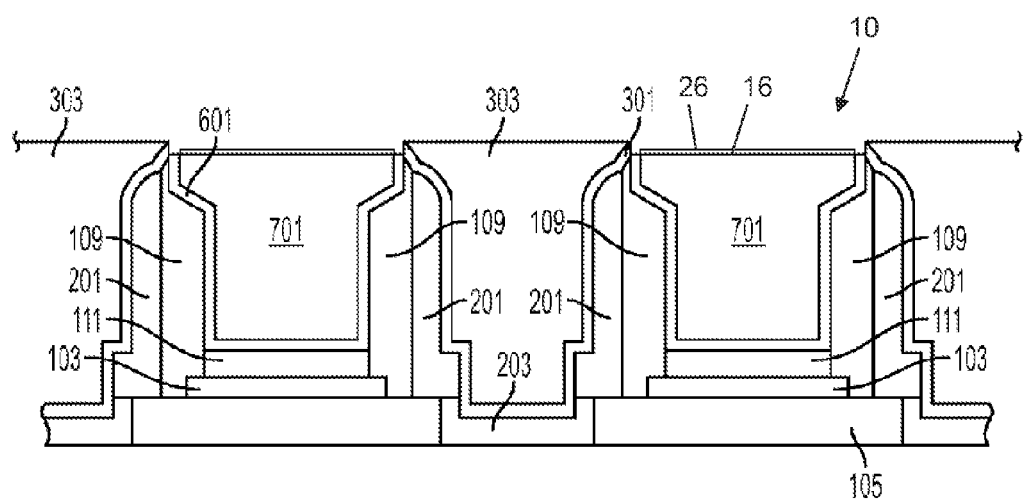

As shown in FIG. 5, in certain embodiments, the surface treatment process includes depositing a monolayer meta-stable film 26 on the exposed surface 16 of the structure 10. The meta-stable layer 26 is not reactive with the structure 10. In such embodiments, the removal process includes decomposing the meta-stable layer 26 to generate etching of the exposed surface 16 of the structure 10. For example, the meta-stable layer 26 may undergo decomposition by thermal annealing. The meta-stable layer material is selected such that it decomposes to a material that generates etching chemistry with the structure 10. As a result, the limited amount 18 of the structure 10 is consumed during reaction with the decomposed material and results in the structure 10 shown in FIG. 3. The limited amount 18 of the structure 10 may be easily controlled through uniform and precise control of the deposition of the monolayer meta-stable film. Alternatively, as a further example, the substrate can be cooled to a temperature that promotes etchant to be condensed on the surface in a controllably small amount; wherein the low temperature precludes any immediate reaction. After removal of any excess etchant, the substrate is warmed sufficiently to permit the controlled and limited reaction. As an example, the etchant can be vapor HF condensed onto the substrate, with the limited reaction being removal of silicon dioxide. As with other embodiments, the surface treatment and removal processes are then repeated for a selected number of iterations to form the recess 24 of desired depth as shown in FIG. 4.

Figure 6:
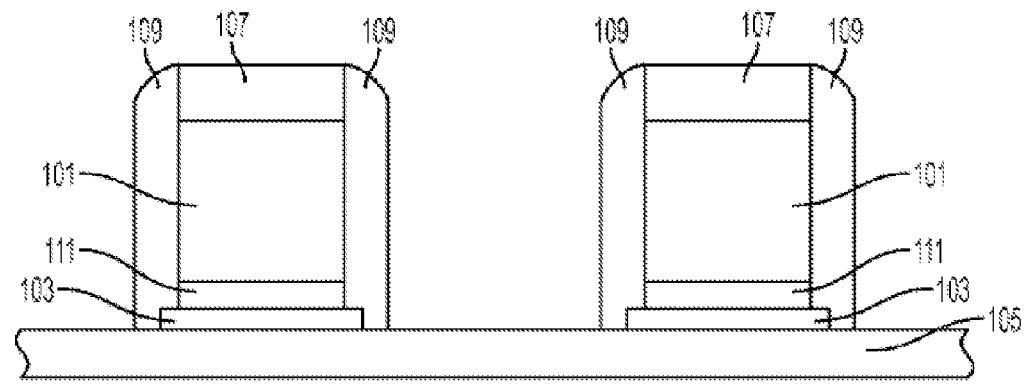
FIGS. 6-12 schematically illustrate, in cross-sectional views, processes for forming a replacement gate electrode according to an exemplary embodiment.

Referring to FIG. 6, formation of the structure of FIGS. 1-5, specifically a replacement gate electrode, in accordance with an exemplary embodiment, begins with a self-aligned contact process. A removable gate electrode 101 made of, for example, polysilicon, is formed on gate dielectric layer 103 on a silicon substrate 105. Gate dielectric layer 103 may be a high-K dielectric, for example having a dielectric constant of about 25 or greater, and a thin metal layer 111, e.g., of titanium nitride (TiN), may be deposited on the gate dielectric layer 103. A nonconductive hardmask layer 107, such as a nitride, is formed on removable gate electrode 101 to prevent the gate electrodes from being exposed during later source/drain silicidation. Sidewall spacers 109 are formed on both sides of removable gate electrode 101 to encapsulate the removable gate electrode 101.

Figure 7:
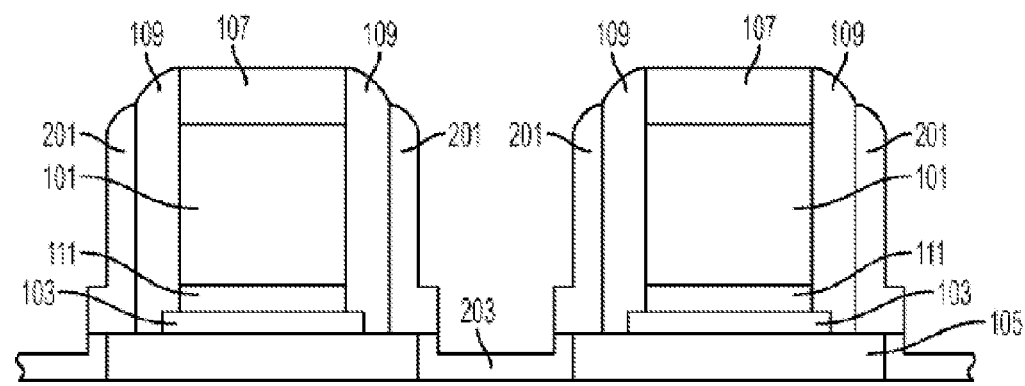

As illustrated in FIG. 7, additional spacers 201 are formed on spacers 109 to define the area for silicidation over source/drain regions of the integrated circuit device. Although only two sets of spacers (109 and 201) are shown, any number of spacers may be included and typically are formed from an oxide or nitride. Next, a metal silicide 203, e.g., nickel or nickel platinum silicide, is formed on substrate 105 in the region between the spacers.

Figure 8:
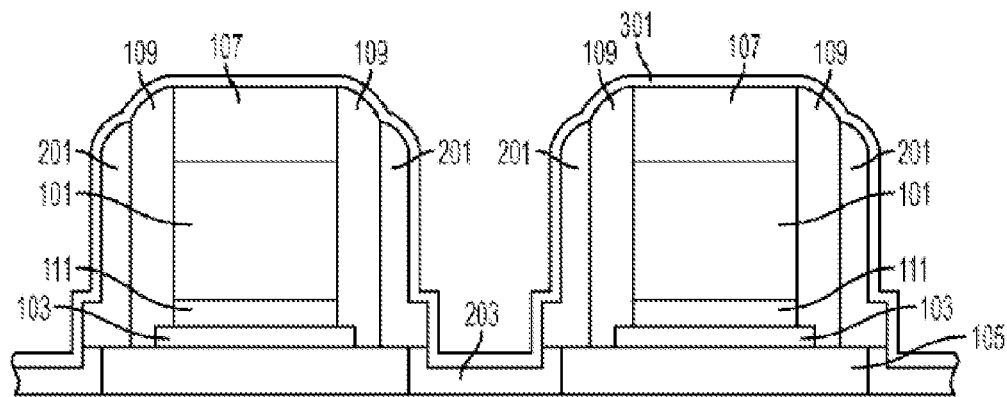

After the silicidation (which is an optional process), an SAC stop layer 301 is conformally deposited over spacers 201 and 109, hardmask layer 107, and silicide 203, as shown in FIG. 8. SAC stop layer 301 may be, for example, a hafnium oxide ($HfO_X$), an aluminum oxide, a silicon carbide, or any highly etch resistant dielectric material that is different from the spacers and exhibits good conformality. Stop layer 301 may be deposited to a thickness of about 1 nm to about 10 nm, e.g., about 2 nm. An isolation material, e.g. an oxide, a nitride, an oxide plus a stress material, such as a nitride, or low-k dielectrics, is deposited over the entire substrate to form isolation layer or inter layer dielectric 303.

Figure 9:
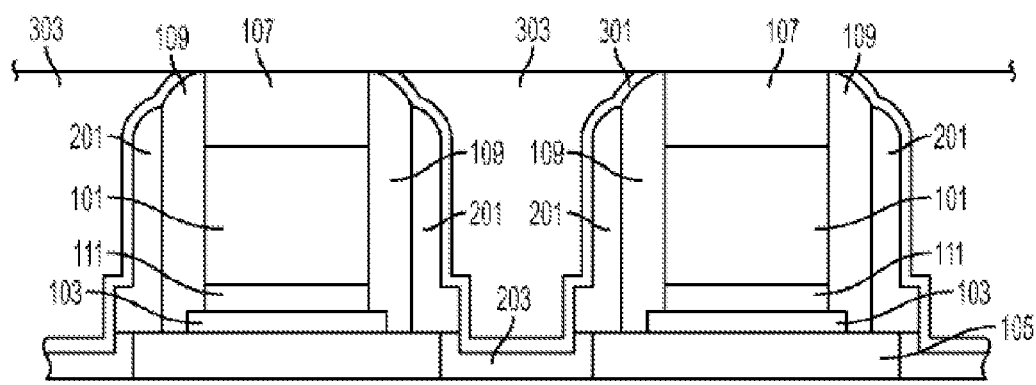

Referring to FIG. 9, the method continues with the replacement gate process. Isolation layer 303 and SAC stop layer 301 are polished, e.g., by chemical mechanical polishing (CMP), down to hardmask layer 107. Alternatively, isolation layer 303 may be polished back to the stop layer 301, and then the stop layer may be etched off, stopping at hardmask layer 107.

Figure 10:
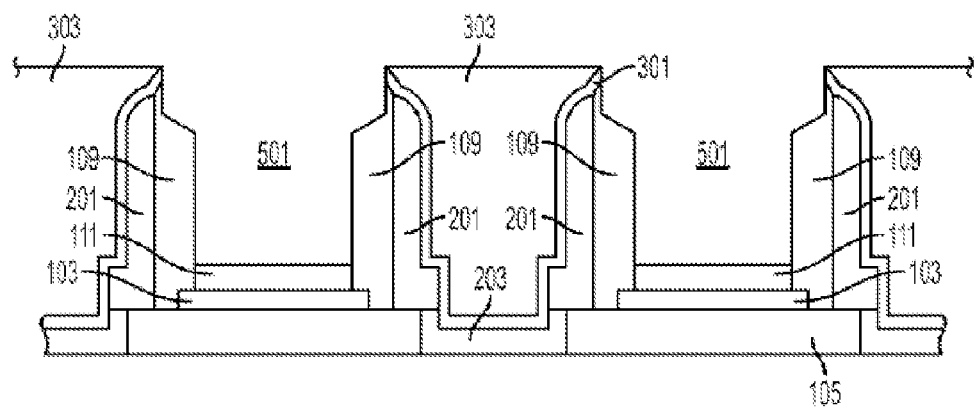

After hardmask layer 107 is exposed, hardmask layer 107, removable gate electrode 101, and a portion of spacer 109 are removed, forming cavity 501, as illustrated in FIG. 10. Wet chemistry and/or a combination of dry and wet chemistries may be employed for removing hardmask layer 107 and removable gate electrode 101.

Figure 11:
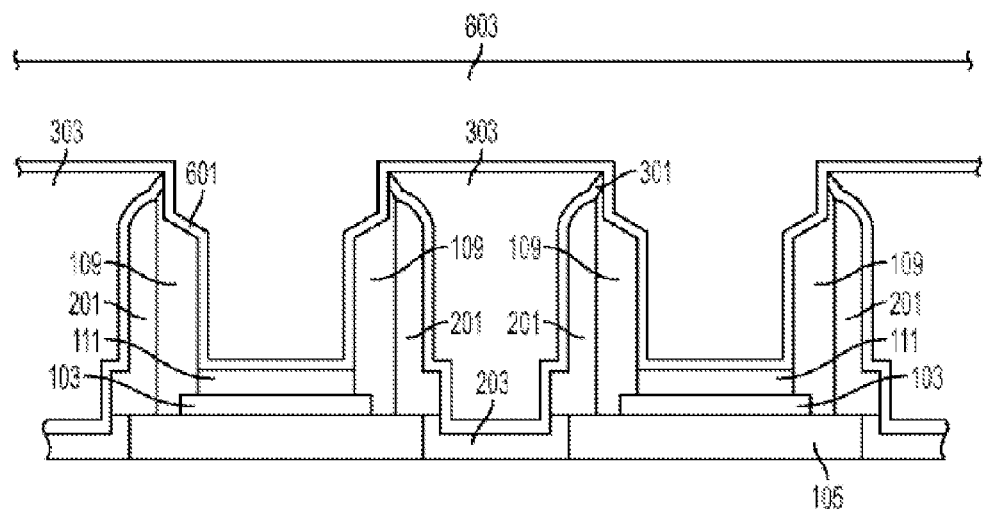

As illustrated in FIG. 11, a metal lining 601, e.g., a TiN layer, is then conformally deposited on isolation layer 303 and on the sidewalls and bottom surface of cavity 501 as a barrier layer. A fill 603, e.g., aluminum or silicon, is then deposited in cavity 501 and on metal lining 601. Fill 603 may alternatively be any metal, e.g., titanium, that can be selectively grown into a dielectric material, e.g., by nitridation or direct thermal oxidation. Fill 603 is then polished back or planarized to self align the replacement gate metal to the gate liner, thereby forming replacement gate electrode 701 (previously identified as structure 10), as illustrated in FIG. 12.

Figure 12:
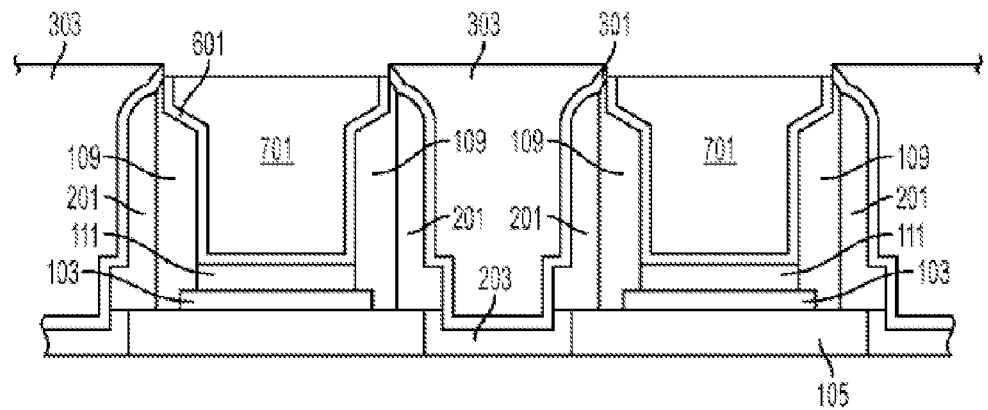
Figure 13:
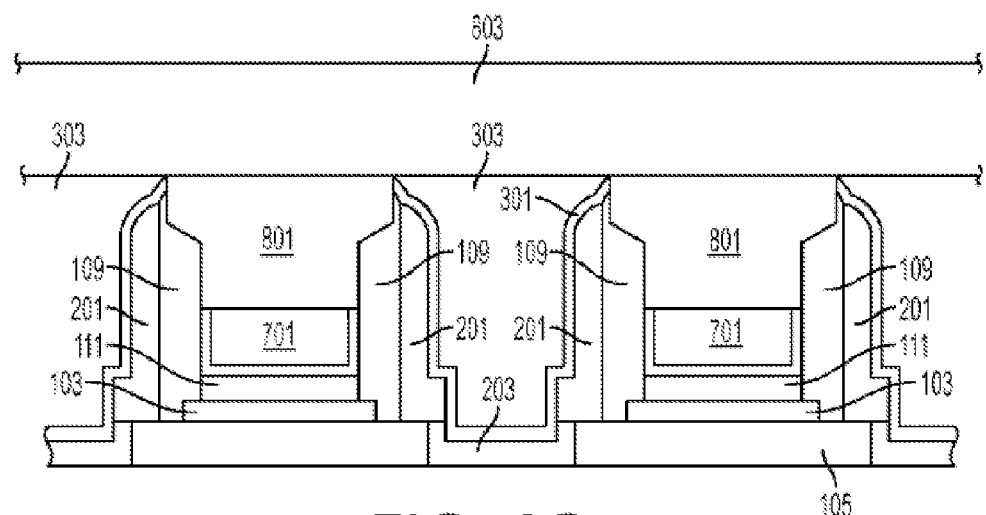
FIG. 13 schematically illustrates, in cross-sectional views, preparation of a self-aligned contact, according to an exemplary embodiment.

The electrode structure 701 (or 10) of FIG. 12 is then recessed according to the methods discussed in relation to FIGS. 1-5. After gap fill metal recess, and workfunction metal liners removal (which can be done before, during or after the gap fill metal recess), a dielectric cap layer 801 such as SiN, HfO2, Al2O3, etc, is formed by deposition and polishing and a capping layer 803, which is different from cap 801 is formed over cap 801 as shown in FIG. 13 Then, the self-aligned contact process continues as is conventionally known.

The embodiments of the present disclosure can achieve several technical effects, including enhanced control of recessing processes to provide improved WIW and WTW uniformity. The present disclosure enjoys industrial applicability in fabricating any of various types of highly integrated circuit devices, particularly with a gate pitch of about 80 nm or smaller.

Further, it is noted that during the recessing processes described herein, other work function metals on the wafer substrate may be recessed according to desired processes in the integrated circuit fabrication scheme. Also, while the recessing of gate electrodes is specifically illustrated and described above, it is understood that the recessing processes herein can be applied to any integrated circuit structure in which enhanced control of recessing is desirable.

Accordingly, integrated circuit fabrication methods have been provided. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the integrated circuit fabrication methods in any way. Rather, the foregoing detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A semiconductor device fabrication method having enhanced control in recessing processes comprising:
   forming a structure;
   performing a surface treatment process that transforms an exposed surface of the structure to an intermediate removable layer having a thickness of less than ten atomic layers; and
   performing a removal process to remove the intermediate removable layer.

2. The method of claim 1 further comprising repeating the surface treatment process and the removal process to form a recess at a peripheral portion of the structure.

3. The method of claim 1 wherein the intermediate removable layer is an oxidized layer, wherein performing a surface treatment process includes oxidizing the exposed surface of the structure to create the oxidized layer, and wherein performing the removal process comprises etching the oxidized layer.

4. The method of claim 1 wherein performing a surface treatment process transforms the exposed surface to the intermediate removable layer at least as rapid as the removal process removes the intermediate removable layer.

5. The method of claim 1 wherein the surface treatment process and removal process are performed concurrently or in alternate cycles.

6. The method of claim 1 wherein performing the surface treatment process comprises depositing a meta-stable film of controlled thickness on the exposed surface of the structure; and wherein the removal process is performed by decomposing the meta-stable layer to generate etching of the exposed surface of the structure.

7. The method of claim 6 wherein the deposited meta-stable film thickness is one monolayer.

8. A semiconductor device fabrication method comprising:
   forming a replacement gate electrode over a substrate;
   preparing a limited amount of the replacement gate electrode for removal by performing a surface treatment process that transforms an exposed surface of the replacement gate electrode to an intermediate removable layer;
   performing a removal process to remove the intermediate removable layer;
   repeating the preparing and the performing to form a recess at a peripheral portion of the replacement gate electrode;
   depositing a dielectric layer in the recess;
   forming an insulating cap on top of the gate electrode and the dielectric layer and forming a contact.

9. The method of claim 8 wherein preparing comprises preparing the limited amount having a depth of less than ten atomic layers.

10. The method of claim 8 wherein the intermediate removable layer is an oxidized layer, and wherein transforming includes oxidizing the exposed surface of the replacement gate electrode to create the oxidized layer.

11. The method of claim 8 wherein the removal process is performed by etching the intermediate removable layer.

12. The method of claim 11 wherein workfunction metals are etched while etching the intermediate removable layer.

13. The method of claim 8 wherein the surface treatment process and removal process are performed concurrently.

14. The method of claim 8 wherein the surface treatment process and removal process are performed in alternate cycles.

15. The method of claim 7 wherein performing the surface treatment process comprises depositing a meta-stable film of controlled thickness on the exposed surface of the replacement gate electrode, and wherein the removal process is performed by decomposing the meta-stable layer to generate removal of the exposed surface of the replacement gate electrode.

16. The method of claim 8 wherein forming the replacement gate electrode over a substrate comprises forming the replacement gate electrode of a metal or semiconductor materials.

17. The method of claim 8 wherein forming the replacement gate electrode comprises:
   forming a removable gate electrode over the substrate;
   removing the removable gate electrode to define an opening; and
   forming the replacement gate electrode in the opening.

18. A semiconductor device fabrication method comprising:
   forming a structure;
   preparing a limited amount of the structure for removal by performing a surface treatment process that transforms an exposed surface of the structure to an intermediate removable layer; and
   performing a removal process to remove the intermediate removable layer.

19. The semiconductor device fabrication method of claim 18 wherein forming a structure comprises:
   forming a removable gate electrode over a substrate, the removable gate electrode including polysilicon;
   forming a hardmask over the polysilicon;

forming spacers on side surfaces of the removable gate electrode;
forming a silicide on the substrate;
depositing an SAC stop layer over the hardmask layer, the spacers, and the silicide;
depositing an isolation material over the SAC stop layer;
removing the hardmask layer and the polysilicon from the removable gate electrode to form an opening;
depositing a metal lining in the opening;
depositing a fill on the metal lining in the opening to form a replacement gate electrode, wherein the replacement gate electrode is the structure; and wherein the method further comprises:
repeating the preparing and the performing to form a recess at an upper portion of the replacement gate electrode;
depositing a dielectric layer in the recess; and
forming a self-aligned contact.

20. The method of claim 18 wherein preparing a limited amount of the structure for removal comprises preparing the limited amount having a depth of less than ten atomic layers.

\* \* \* \* \*

UNITED STATES PATENT AND TRADEMARK OFFICE
CERTIFICATE OF CORRECTION

PATENT NO. : 8,617,973 B2  
APPLICATION NO. : 13/247763  
DATED : December 31, 2013  
INVENTOR(S) : Ruilong Xie and Robert J. Miller Page 1 of 1

It is certified that error appears in the above-identified patent and that said Letters Patent is hereby corrected as shown below:

In the Claims:

Column 8, line 37, after claim, please delete "7" and insert therefore --8--.

Signed and Sealed this  
Twenty-fourth Day of June, 2014

Michelle K. Lee  
*Deputy Director of the United States Patent and Trademark Office*